(12) United States Patent
Dinnipati et al.

(10) Patent No.: US 11,881,241 B2
(45) Date of Patent: Jan. 23, 2024

(54) RESISTIVE MEMORY ARRAY WITH LOCALIZED REFERENCE CELLS

(71) Applicant: GlobalFoundries U.S. Inc., Malta, NY (US)

(72) Inventors: Chandrahasa Reddy Dinnipati, Andhra Pradesh (IN); Ramesh Raghavan, Hyderabad (IN); Bipul C. Paul, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 127 days.

(21) Appl. No.: 17/709,525

(22) Filed: Mar. 31, 2022

(65) Prior Publication Data

US 2023/0317130 A1 Oct. 5, 2023

(51) Int. Cl.
*G11C 11/16* (2006.01)
*G11C 7/06* (2006.01)

(52) U.S. Cl.
CPC ............ *G11C 11/1673* (2013.01); *G11C 7/06* (2013.01); *G11C 11/1655* (2013.01); *G11C 11/1657* (2013.01); *G11C 11/1675* (2013.01)

(58) Field of Classification Search
CPC ... G11C 11/1673; G11C 7/06; G11C 11/1655; G11C 11/1657; G11C 11/1675
See application file for complete search history.

(56) References Cited

U.S. PATENT DOCUMENTS

| | | | |
|---|---|---|---|
| 2,501,599 A * | 3/1950 | Eltenton | G01N 21/05 356/411 |
| 7,835,210 B2 | 11/2010 | Shimizu | |
| 8,189,363 B2* | 5/2012 | Tsuchida | G11C 11/1675 365/158 |
| 8,687,412 B2 | 4/2014 | Chih et al. | |
| 9,293,215 B2 | 3/2016 | Yoo et al. | |
| 9,734,883 B1 | 8/2017 | Yu et al. | |
| 10,157,654 B2 | 12/2018 | Lee et al. | |
| 10,163,478 B2 | 12/2018 | Jung et al. | |
| 10,210,931 B2 | 2/2019 | Kim | |
| 11,120,857 B2 | 9/2021 | Jaiswal et al. | |
| 2002/0154531 A1* | 10/2002 | Lowrey | G11C 13/0023 365/100 |
| 2004/0114444 A1* | 6/2004 | Matsuoka | G11C 11/5685 365/200 |

(Continued)

OTHER PUBLICATIONS

Dong et al., "A 1-Mb 28-nm 1T1MTJ STT-MRAM With Single-Cap Offset-Cancelled Sense Amplifier and In Situ Self-Write-Termination," IEEE Journal of Solid-State Circuits, vol. 54, No. 1, 2019, pp. 231-239.

(Continued)

*Primary Examiner* — Khamdan N. Alrobaie
(74) *Attorney, Agent, or Firm* — David Cain; Hoffman Warnick LLC

(57) ABSTRACT

A structure includes an array of nonvolatile memory cells, wordlines and bitlines connected to the nonvolatile memory cells, sense amplifiers connected to the nonvolatile memory cells, and reference cells connected to the sense amplifiers. Each of the reference cells has a transistor connected to a variable resistor, one of the wordlines, a reference bitline separate from the bitlines, and the sense amplifiers.

20 Claims, 3 Drawing Sheets

(56) References Cited

U.S. PATENT DOCUMENTS

| | | | |
|---|---|---|---|
| 2015/0092469 A1* | 4/2015 | Kim | G11C 11/16 |
| | | | 365/158 |
| 2016/0093350 A1* | 3/2016 | Jung | G11C 11/1653 |
| | | | 365/158 |
| 2017/0110171 A1* | 4/2017 | Seo | G11C 17/02 |
| 2019/0088328 A1* | 3/2019 | Antonyan | G11C 7/08 |
| 2020/0090724 A1* | 3/2020 | Antonyan | G11C 11/1673 |
| 2022/0051709 A1 | 2/2022 | Jaiswal et al. | |
| 2023/0178132 A1* | 6/2023 | Kang | G11C 13/004 |
| | | | 365/158 |

OTHER PUBLICATIONS

Wei et al., "A 7Mb STT-MRAM in 22FFL FinFET Technology with 4ns Read Sensing Time at 0.9V Using Write-Verify-Write Scheme and Offset-Cancellation Sensing Technique," IEEE International Solid-State Circuits Conference, 2019, pp. 213-216.

\* cited by examiner

RESISTIVE MEMORY ARRAY WITH LOCALIZED REFERENCE CELLS

BACKGROUND

Field of the Invention

The present disclosure relates to memory arrays and more specifically to memory arrays with reference cells.

Description of Related Art

Electronic devices use memory arrays to store data. Within memory arrays the cells are arranged in columns (along bitlines) and rows (along wordlines). Memory arrays can be volatile and once power is no longer present, all data stored in a volatile memory array is lost. In contrast, nonvolatile memory (NVM) arrays do not lose data when power is terminated.

Resistive NVM arrays are high speed, provide low power consumption and low area consumption. Resistive memory arrays use a sense amplifier to determine the data value within the memory cell selected by the intersection of selected bitlines and wordlines. The sense amplifier compares a voltage produced by the resistance within a memory cell to a voltage produced by a reference resistance to determine the data value within the selected memory cell.

In some examples, resistive structures can be magnetic-based (e.g., magnetic random access memory (MRAM)) and these can include spin transfer torque-magnetic tunnel junction magnetic random access memory (STT-MTJ MRAM), spin-orbit-torque MRAM (SOT-MRAM), and voltage controlled magnetic anisotropy magnetic tunnel junction magnetic random access memory (VCMA-MTJ MRAM).

A typical MRAM cell includes a field effect transistor (FET) (e.g., an n-type field effect transistor (NFET)), and a magnetic tunnel junction (MTJ) device. The FET and MTJ are connected in series between a source line and a bitline with a gate of the FET controlled by the state of a wordline. A MTJ is a back end of the line (BEOL) multi-layer structure, which includes a fixed ferromagnetic layer (i.e., a pinned layer) and a switchable ferromagnetic layer (i.e., a free layer) separated by a thin dielectric layer (e.g., a thin oxide layer).

In resistive memory arrays, sensing can be difficult, for example due to limited tunnel magnetoresistance (TMR) in MRAMs. Further, in resistive memory arrays the sensing margin can be highly dependent on the spread and variability of the resistances provided to the sense amplifiers.

SUMMARY

According to an embodiment herein, a structure includes an array of nonvolatile memory cells, wordlines and bitlines connected to the nonvolatile memory cells, sense amplifiers connected to the nonvolatile memory cells, a variable resistor, and reference cells connected to the sense amplifiers. Each of the reference cells has a transistor connected to the variable resistor, one of the wordlines, a reference bitline separate from the bitlines, and the sense amplifiers.

In another embodiment herein, a structure includes an array of magnetic random access memory (MRAM) cells, wordlines and bitlines connected to the MRAM cells, sense amplifiers connected to the MRAM cells, a variable resistor, and reference cells connected to the sense amplifiers. Each of the reference cells has a transistor connected to the variable resistor, one of the wordlines, a reference bitline separate from the bitlines, and the sense amplifiers.

An additional embodiment herein is a structure having an array of magnetic random access memory (MRAM) cells, wordlines and bitlines connected to the MRAM cells, sense amplifiers connected to the MRAM cells, a variable resistor (having switches connected to resistive polysilicon resistors), and reference cells connected to the sense amplifiers. Each of the reference cells includes a transistor connected to the variable resistor, one of the wordlines, a reference bitline separate from the bitlines, and the sense amplifiers.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, in resistive memory arrays the sensing margin can be highly dependent on the spread and variability of the resistances that control the voltage provided to the sense amplifiers. For example, identical components in different areas of a circuit can experience different resistance amounts based on slight manufacturing variations, temperature variations, voltage variations, etc. Because sense amplifiers within resistive memory arrays rely upon the voltage difference produced between a reference resistance and the resistance within a selected memory cell to detect the data values within memory cells, these slight voltage variations across the array can make data sensing inconsistent.

In order to address such issues, the structures herein use localized reference cells to provide a localized reference resistance that control the voltage supplied to the sense amplifiers. The localized reference cells experience the same manufacturing, voltage, and environmental conditions as the memory cells with which they share a wordline, and this allows the localized reference cells to provide the sense amplifier a reference resistance based voltage that is localized (adjusted) to match the resistance components of the adjacent memory cells.

Figure 1:
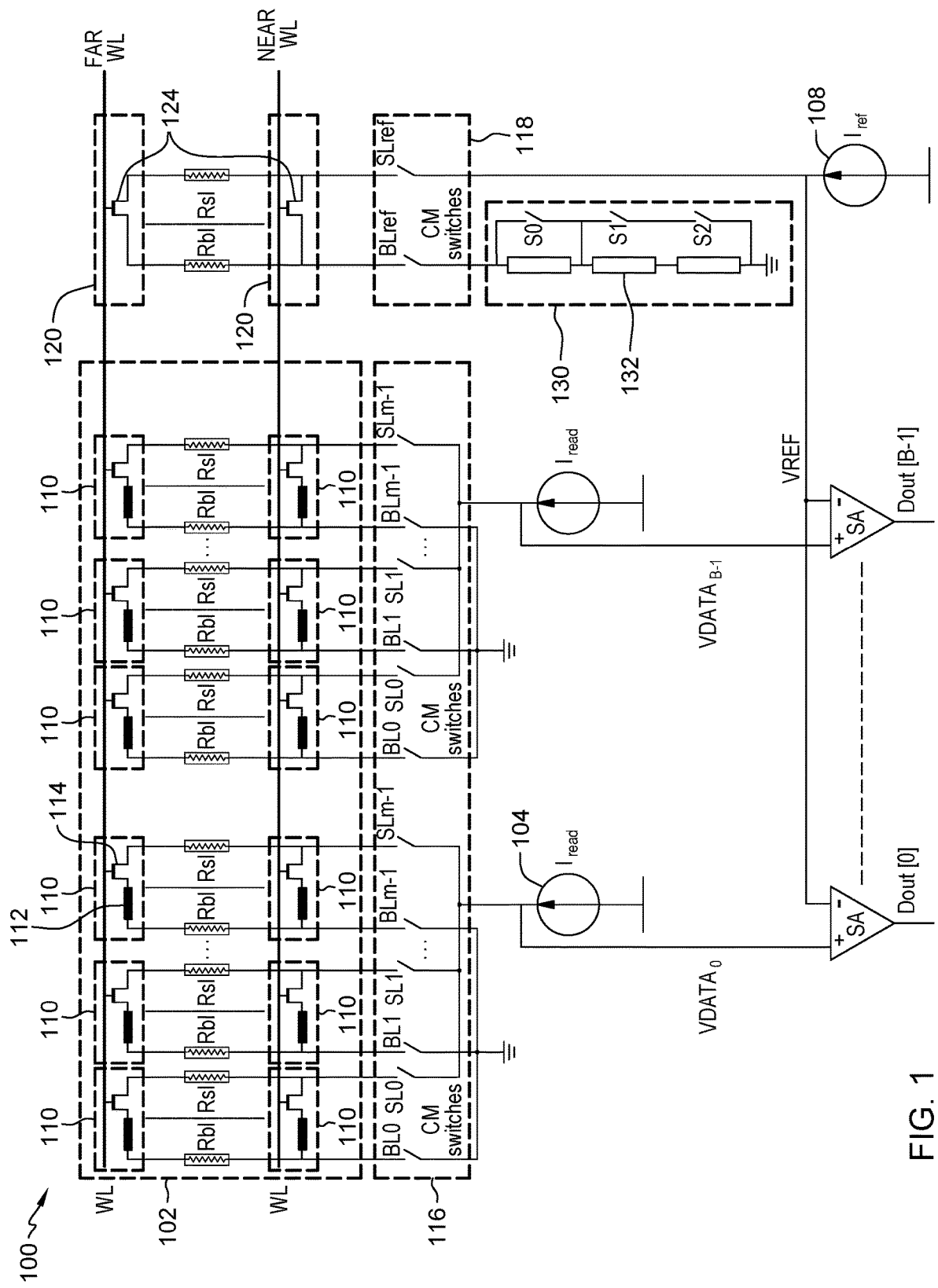
FIGS. 1 and 2 are schematic diagrams illustrating memory array structures according to embodiments herein.

FIG. 1 illustrates one exemplary memory array structure 100 embodiment herein that includes an array 102 of magnetic random access memory (MRAM) cells 110. As shown, wordlines WL, bitlines BL (e.g., BL0, BL1, etc.), and source lines SL (e.g., SL0, SL1, etc.) are connected to the MRAM cells 110. The bitlines BL and source lines SL each have their own resistance Rb1 and Rs1, as shown in FIG. 1.

Each of the MRAM cells 110 includes transistors 114 (e.g., field effect transistors (FETs)) connected to (resistive) magnetic tunnel junction (MTJ) memory elements 112. As shown in FIG. 1, the wordlines WL are connected to the gates of the transistors 114. Activation of the wordlines WL makes the transistors 114 conductive, forming a circuit from a read current source 104, along the source lines SL (that are connected to the sources of the transistors 114), through the transistors 114, to the MTJ memory elements 112 (that are connected to the drains of the transistors 114) and then to ground. This circuit allows the resistance within the MTJ memory elements 112 to establish the data voltage (VDATA) at one input of sense amplifiers SA that, as also shown in FIG. 1, are connected to the MRAM cells 110.

As shown in FIG. 1, the reference cells 120 are connected to the sense amplifiers SA. As noted above, the reference cells 120 have a localized resistance (or wordline-specific resistance) that establishes a reference voltage (VREF) that the sense amplifiers SA compare the data voltage VDATA to establish an output data value (Dout). In one example, whether the data voltage VDATA matches (or is within an acceptable range (e.g., 10%, 20%, etc.) of) the reference voltage VREF determines whether the sense amplifier SA will output a logic 1 or logic 0.

As shown in FIG. 1, the reference cells 120 are connected to a variable resistor 130. The variable resistor 130 has switches S0-S2 connected to individual resistive polysilicon resistors 132. The switches are set to selectively engage more or fewer resistive polysilicon resistors 132 to change the overall resistance of the variable resistor 130, as needed.

The reference cells 120 also includes transistors 124 connected to the variable resistor 130, the wordlines WL, a reference bitline BLref (that is separate from the other bitlines BL), and the sense amplifiers SA. FIG. 1 shows that the transistors 124 in the reference cells 120 are directly connected by only wiring to the reference bitline BLref, and are connected without any other components being between the transistor 124 and the reference bitline BLref (except for the wiring itself). In other words, the reference cells 120 does not include the MTJ memory elements 112 that is included in the MRAM cells 110, but otherwise the reference cells 120 and MRAM cells 110 are similar or identical.

The transistors 124 in the reference cells 120 include a drain connected to ground through the variable resistor 130 (forming the reference bitline BLref), a gate (one of the wordlines WL), and a source connected to one of the sense amplifiers SA and to a reference current source 108 (forming the reference source line SLref). Thus, activation of the transistors 124 (that occurs when the gate-connected wordlines WL are energized) forms a reference resistance circuit (from the reference current source 108, through the transistors 124, and to ground through the variable resistor 130) that produces the reference voltage VREF supplied to the sense amplifier SA. Additionally, FIG. 1 shows switches 116, 118 (e.g., CM switches) that selectively connect/disconnect aspects of the memory array 102 and reference cells 120, as needed.

As noted above, the MRAM cells 110 in this example include resistive magnetic tunnel junction (MTJ) memory elements 112, and the reference cells 120 is identical to one of the MRAM cells 110 except the reference cells 120 lacks the resistive MTJ memory elements 112. In place of the resistive MTJ memory elements 112 the reference cells 120 are connected to the variable resistor 130.

As shown in FIG. 1, the wiring within the MRAM cells 110 and reference cells 120 has a specific resistance. In some examples, the resistance of the bitlines is labeled Rb1 and the resistance of the source lines is labeled Rs1. Here the polysilicon resistors 132 within the variable resistor 130 are made of the same material as the wiring that forms the wordlines WL and bitlines BL. This allows the polysilicon resistors 132 to experience the same manufacturing and environmental resistance variations that the wordlines WL and bitlines BL experience, thereby automatically (without any other adjustment) changing the resistance of all such structures in a similar way and to a similar extent. These changes in resistance resulting from manufacturing variations and chip location are substantially smaller (e.g., 1/10, 1/100, 1/1000, etc.) than the resistance changes produced by engagement/disengagement of individual polysilicon resistors 132 through operation of the switches S0-S2.

Because the polysilicon resistors 132, wordlines WL, and bitlines BL are all made of the same material (polysilicon in this example) and all such components are located in the same chip/array location (e.g., along the same wordline), the likelihood of such components experiencing different resistance variations that result in sensing margin (that is dependent on the spread and variability of the resistances) is significantly reduced or eliminated. Therefore, the structures herein are specifically designed to selectively adjust the reference voltage depending upon where the selected memory cell is located (i.e., which row) in order to minimize read margin variations caused by variations in the distances between the rows and the line of sense amplifiers.

Figure 2:
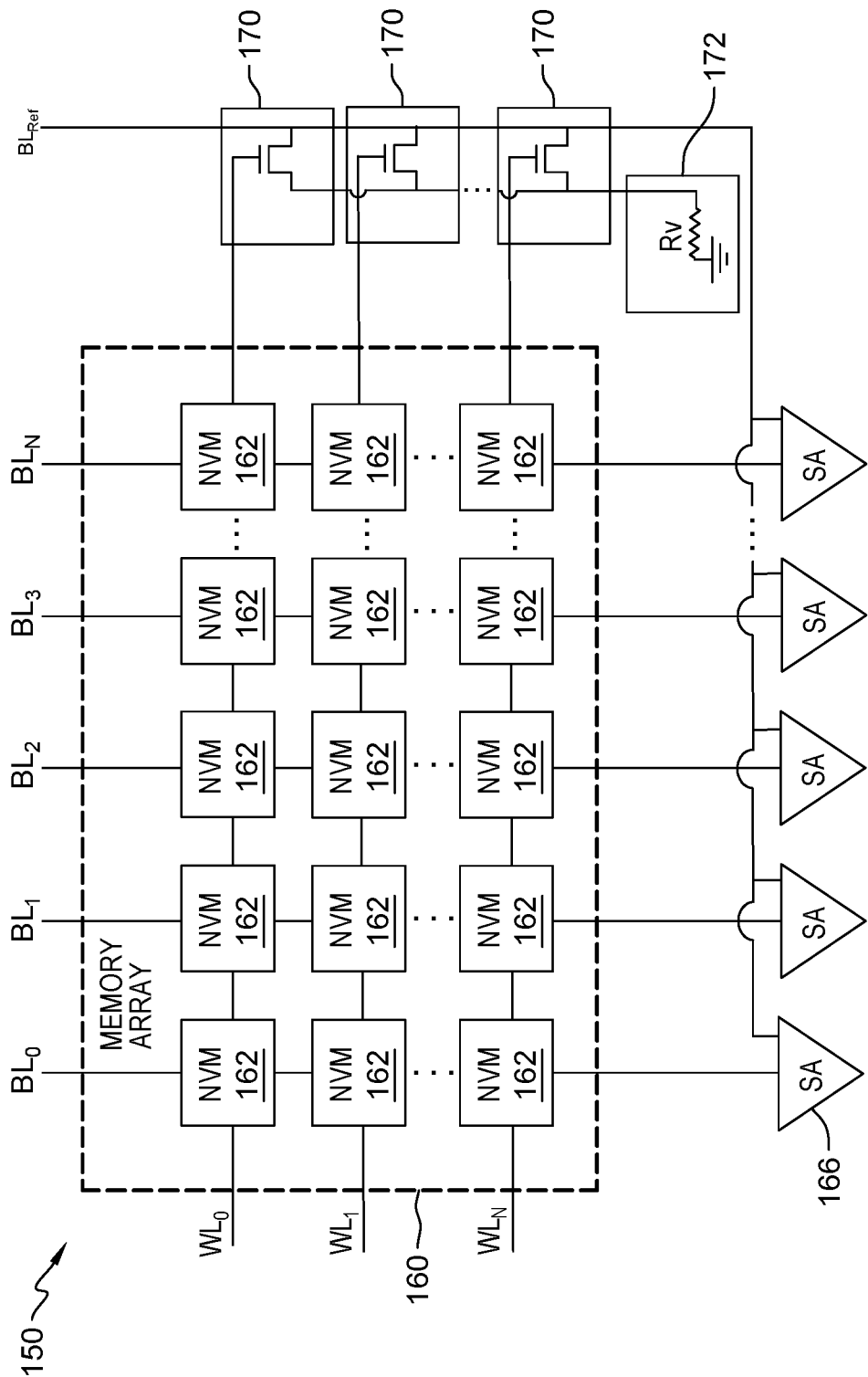

FIG. 2 illustrates another memory array structure 150 embodiment herein. As shown in FIG. 2, the memory array structure 150 includes a memory array 160 of non-volatile memory (NVM) cells 162 connected to wordlines WL and bitlines BL. The bitlines BL output to sense amplifiers SA 166. The sense amplifiers utilize voltage based on the reference resistance provided from reference cells 170 for comparison with the voltage output on the bitlines BL. Note that the NVM cells 162 and reference cells 170 are discussed in greater detail with respect to FIGS. 3 and 4.

FIG. 2 shows that multiple reference cells 170 can be connected to an array. In this example, each wordline WL is connected to a corresponding reference cell 170 (that can be thought of as a wordline-specific reference cell). All reference cells 170 are connected to a reference bitline BLref that is separate from the other bitlines BL that are connected to the NVM cells 162.

As with the structure shown in FIG. 1, in FIG. 2 a variable resistor (Rv) structure 172 is connected to the reference cells 170 and the resistors within the variable resistor structure 172 are formed of the same material as the wiring that makes up the bitlines BL and wordlines WL. Additionally, as with FIG. 1, in FIG. 2 the reference cells 170 are physically adjacent the memory array 160 (e.g., connected to the same wordlines). In other words, with structures herein the reference cells are directly physically adjacent to the memory arrays and directly connected to the memory arrays (e.g., directly connected to the wordlines of the memory array) without any other components being physically positioned between the reference cells and the memory array within the chip. Stated differently, the reference cells(s) and corresponding memory arrays can both be physically located within a very small percentage chip area (e.g., less than 1%, less than 0.1%, etc.) of the overall area of chip. Again, because the resistors, wordlines, and bitlines are all made of the same material and all such components are located in the same chip/array location, with structures herein the likelihood of such components experiencing different manufacturing/chip location resistance variations that result in sensing margin (that is dependent on the spread and variability of the resistances) is significantly reduced or eliminated.

Figure 4:
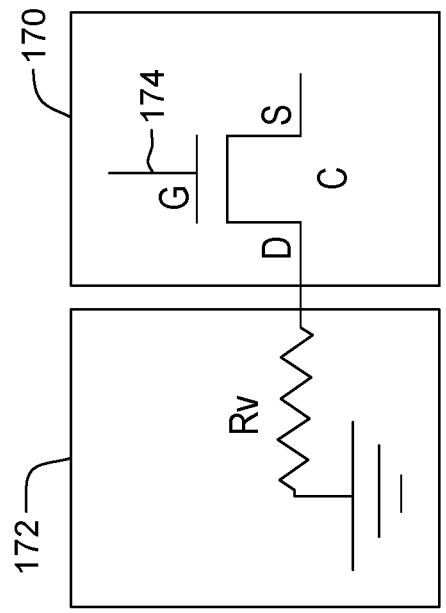
FIG. 4 is a schematic diagram illustrating a reference resistance structure according to embodiments herein.
Figure 3:
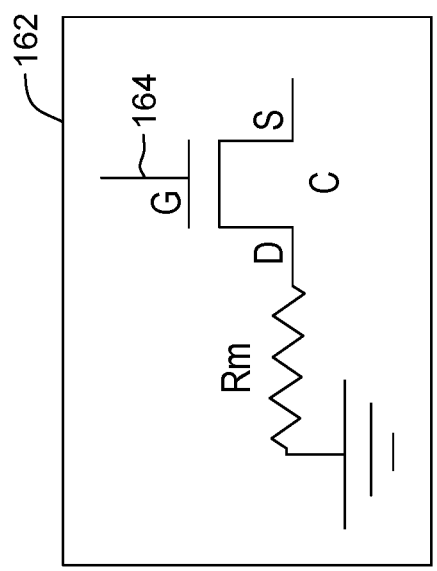
FIG. 3 is a schematic diagram illustrating a memory cell structure according to embodiments herein.

FIGS. 3 and 4 show some details of the NVM cell 162 and reference cells 170 shown in FIG. 2. As can be seen in FIGS. 3 and 4, the NVM cell 162 and reference cells 170 are substantially similar structures and each includes a transistor 164, 174 (that is similar to the transistors 114, 124 shown in FIG. 1) that has a channel structure C separating a drain structure D from a source structure S. The transistors 164, 174 are field effect transistors (FETs) and, therefore, voltage in the gate conductor G controls the conductivity of the channel structure C to provide a conductive path between the source structure S and the drain structure D. In these structures the drain structure D is connected to the bitline BL, the source structure S is connected to the source line, and the gate conductor G is the wordline WL.

In FIG. 3, a resistive memory element Rm is shown in the path from the drain structure D to ground, while in FIG. 4, a variable resistor Rv (e.g., a programmable resistor similar to variable resistor 130 discussed above) 172 is shown in the same path. The resistive memory element Rm can be a device such as the MJT discussed above or can be any other device/material that can change and hold a resistive state, such as phase-change chalcogenides, binary transition metal oxides, perovskites, solid-state electrolytes, organic charge-transfer complexes, organic donor-acceptor systems, two dimensional (layered) insulating materials, etc.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A structure comprising:
   an array of nonvolatile memory cells;
   wordlines and bitlines connected to the nonvolatile memory cells;
   sense amplifiers connected to the nonvolatile memory cells;
   reference cells connected to the sense amplifiers;
   a reference bitline connected to the reference cells, wherein the reference bitline is separate from the bitlines; and
   a variable resistor connected to the reference cells, wherein each of the reference cells comprises a transistor connected to the variable resistor, one of the wordlines, the reference bitline, and the sense amplifiers.

2. The structure according to claim 1, wherein the transistor is directly connected by only wiring to the reference bitline without components being between the transistor and the reference bitline.

3. The structure according to claim 1, wherein the reference cells are each connected to a plurality of the sense amplifiers.

4. The structure according to claim 1, wherein the reference cells are each connected to a different one of the wordlines.

5. The structure according to claim 1, wherein the transistor includes:
   a drain connected to ground through the variable resistor, forming the reference bitline;
   a gate connected to one of the wordlines; and
   a source connected to the sense amplifiers and to a reference current source.

6. The structure according to claim 1, wherein the nonvolatile memory cells comprise a resistive memory element, and wherein the reference cells are identical to the nonvolatile memory cells except the reference cells lacks the resistive memory element.

7. The structure according to claim 1, wherein the reference cells are at a same location within the array as the nonvolatile memory cells with which the reference cells share one of the wordlines.

8. A structure comprising:
   an array of magnetic random access memory (MRAM) cells;
   wordlines and bitlines connected to the MRAM cells;
   sense amplifiers connected to the MRAM cells;
   reference cells connected to the sense amplifiers;

a reference bitline connected to the reference cells, wherein the reference bitline is separate from the bitlines; and a variable resistor connected to the reference cells, wherein each of the reference cells comprises a transistor connected to the variable resistor, the wordlines, the reference bitline, and the sense amplifiers.

9. The structure according to claim 8, wherein the transistor is directly connected by only wiring to the reference bitline without components being between the transistor and the reference bitline.

10. The structure according to claim 8, wherein the reference cells are each connected to a plurality of the sense amplifiers.

11. The structure according to claim 8, wherein the reference cells are each connected to a different one of the wordlines.

12. The structure according to claim 8, wherein the transistor includes:
   a drain connected to ground through the variable resistor, forming the reference bitline;
   a gate connected to one of the wordlines; and
   a source connected to the sense amplifiers and to a reference current source.

13. The structure according to claim 8, wherein the MRAM cells comprise a resistive magnetic tunnel junction (MTJ) memory element, and wherein the reference cells are identical to the MRAM cells except the reference cells lacks the resistive MTJ memory element.

14. The structure according to claim 8, wherein the reference cells are at a same location within the array as the MRAM cells with which the reference cells share one of the wordlines.

15. A structure comprising:
   an array of magnetic random access memory (MRAM) cells;
   wordlines and bitlines connected to the MRAM cells;
   sense amplifiers connected to the MRAM cells;
   reference cells connected to the sense amplifiers;
   a reference bitline connected to the reference cells, wherein the reference bitline is separate from the bitlines; and
   a variable resistor connected to the reference cells, wherein the variable resistor comprises switches connected to resistive polysilicon resistors, wherein each of the reference cells comprises a transistor connected to the variable resistor, the wordlines, the reference bitline, and the sense amplifiers.

16. The structure according to claim 15, wherein the transistor is directly connected by only wiring to the reference bitline without components being between the transistor and the reference bitline.

17. The structure according to claim 15, wherein the reference cells are each connected to a plurality of the sense amplifiers.

18. The structure according to claim 15, wherein the reference cells are each connected to a different one of the wordlines.

19. The structure according to claim 15, wherein the transistor includes:
   a drain connected to ground through the variable resistor, forming the reference bitline;
   a gate connected to one of the wordlines; and
   a source connected to the sense amplifiers and to a reference current source.

20. The structure according to claim 15, wherein the MRAM cells comprise a resistive magnetic tunnel junction (MTJ) memory element, and wherein the reference cells are identical to the MRAM cells except the reference cells lacks the resistive MTJ memory element.

* * * * *